United States Patent [19]

Abbas et al.

[11] Patent Number: 5,093,693
[45] Date of Patent: Mar. 3, 1992

[54] PN-JUNCTION WITH GUARD RING

[75] Inventors: Christian C. Abbas, Baden; Peter Roggwiller, Riedt-Neerach; Jan Voboril, Nussbaumen, all of Switzerland

[73] Assignee: BBC Brown Boveri AG, Baden, Switzerland

[21] Appl. No.: 647,207

[22] Filed: Jan. 28, 1991

Related U.S. Application Data

[63] Continuation of Ser. No. 282,034, Dec. 9, 1988, abandoned.

[30] Foreign Application Priority Data

Oct. 15, 1987 [CH] Switzerland .................. 4050/87

[51] Int. Cl.$^5$ ............................................. H01L 29/90
[52] U.S. Cl. ........................................ 357/13; 357/37; 357/52; 357/90
[58] Field of Search ............... 357/52, 37, 13, 30 A, 357/90

[56] References Cited

U.S. PATENT DOCUMENTS

| | | | |
|---|---|---|---|
| 3,607,449 | 9/1971 | Tokuyama et al. | 148/1.5 |
| 4,017,888 | 4/1977 | Christie et al. | 357/37 |
| 4,638,551 | 1/1987 | Einthoven | 29/571 |
| 4,651,187 | 3/1987 | Sugimoto et al. | 357/52 |
| 4,742,377 | 5/1988 | Einthoven | 357/52 |
| 4,774,560 | 9/1988 | Coe | 357/52 |
| 4,805,004 | 2/1989 | Gandolfi et al. | 357/52 |

FOREIGN PATENT DOCUMENTS

| | | |
|---|---|---|
| 0159544 | 10/1985 | European Pat. Off. . |
| 0168771 | 1/1986 | European Pat. Off. . |
| 0237844 | 9/1987 | European Pat. Off. . |
| 55-085077 | 6/1980 | Japan .................. 357/52 |
| 56-058286 | 5/1981 | Japan .................. 357/52 |
| 58-176978 | 10/1983 | Japan .................. 357/52 |
| 61-015376 | 1/1986 | Japan .................. 357/52 |
| 61-078162 | 4/1986 | Japan .................. 357/52 |
| 63-198383 | 8/1988 | Japan .................. 357/52 |
| 2060257 | 4/1981 | United Kingdom .................. 357/52 |

OTHER PUBLICATIONS

S. M. Sze, *Semiconductor Devices: Physics and Technology*, 1985, pp. 410–411.
Variation of Lateral Doping—A New Concept to Avoid High Voltage Breakdown of Planar Junctions by R. Stengl and U. Gosele, IEEE, 1985, pp. 154–157.
Methods of Avoiding Edge Effects on Semiconductor Diodes by P. A. Tove, J. Physics. D: Appl. Phys, 15 (1982), pp. 517–536.

*Primary Examiner*—Andrew J. James
*Assistant Examiner*—Sara W. Crane
*Attorney, Agent, or Firm*—Oblon, Spivak, McClelland, Maier & Neustadt

[57] ABSTRACT

In a semiconductor component, a pn junction which emerges at a main surface (2) of a semiconductor substrate (1) at the edge of a highly doped zone (3) is formed by a laterally bounded, highly doped zone (3) extending inwards from a main surface (2) of the semiconductor substrate (1) and by a lightly doped zone surrounding the highly doped zone. The edge of the highly doped zone (3) is formed by a guard zone (6b) whose doping density gradually decreases in a direction parallel to the main surface (2) from the highly doped zone (3) towards the pn junction. Any surface breakdown of the pn junction is prevented by the fact that the guard zone (6b) has a maximum penetration depth near the highly doped zone (3) and that the maximum penetration depth of the guard zone (6b) is greater than the penetration depth of the adjacent highly doped zone (3). The guard zone (6b) has a maximum doping density which does not appreciably exceed $10^{15}$ cm$^{-3}$, a width which is comparable with a thickness of the slightly doped zone and a maximum penetration depth which is between 40 μm and 80 μm. The doping density of the guard zone (6b) decreases approximately linearly or stepwise in a direction parallel to the main surface (2).

8 Claims, 5 Drawing Sheets

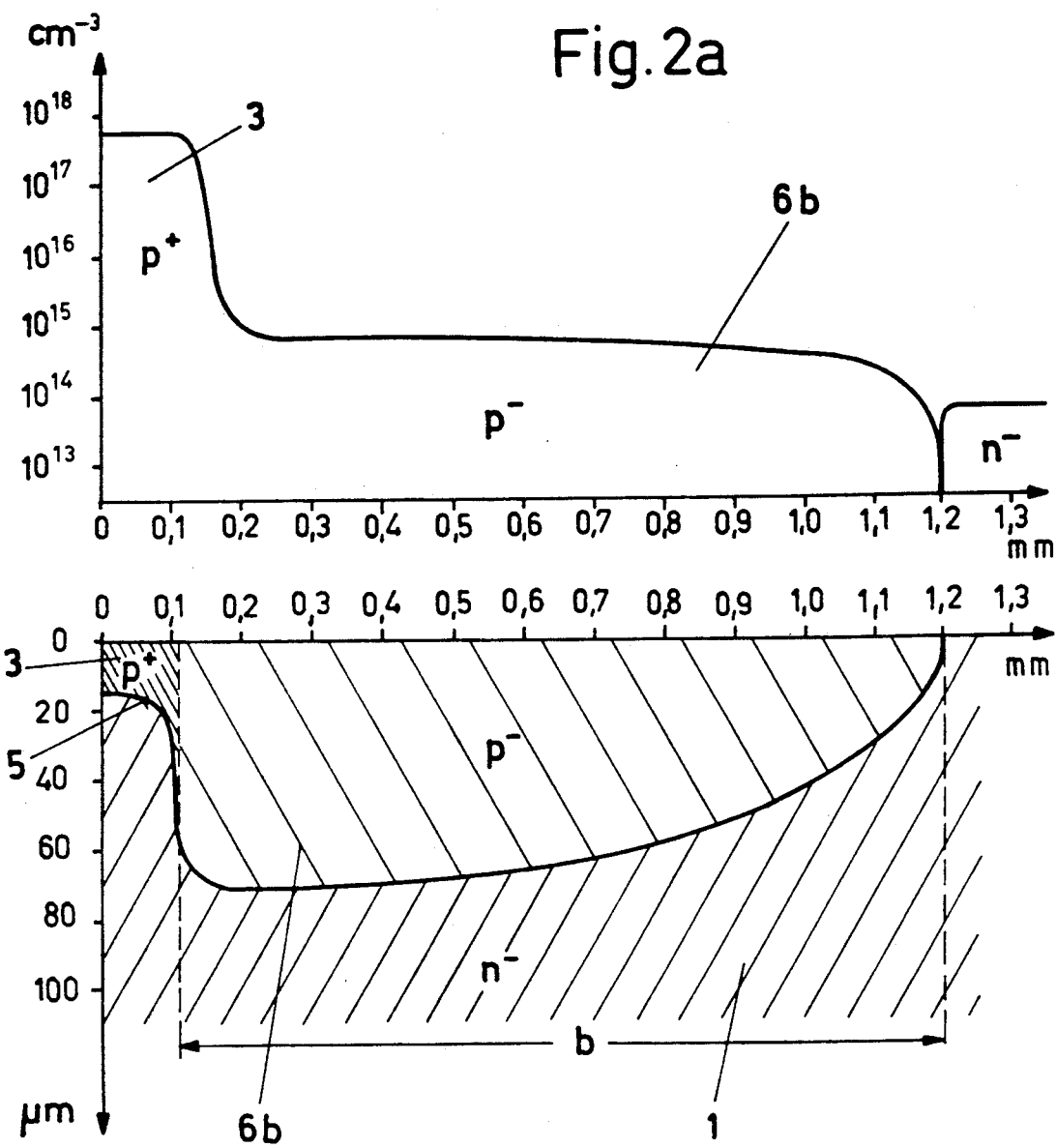
Fig. 2a
Fig. 2b
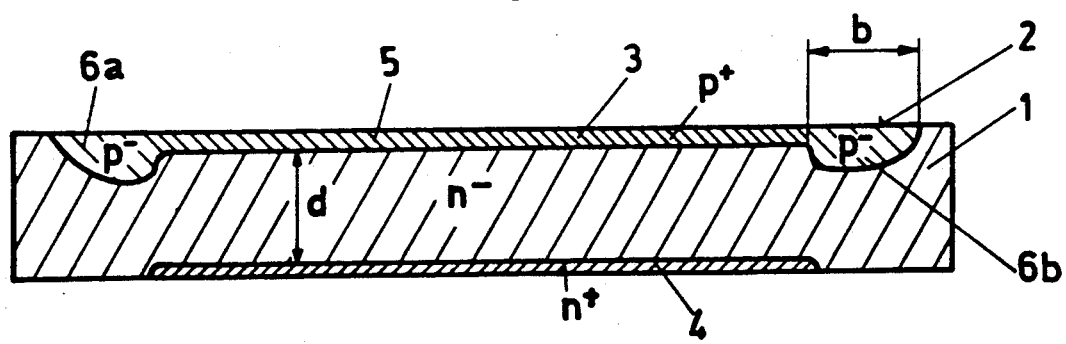
Fig. 1

PN-JUNCTION WITH GUARD RING

This application is a continuation of application Ser. No. 07/282,034, filed on Dec. 9, 1988, now abandoned.

BACKGROUND OF THE INVENTION

1. Field of the invention

The invention relates to a semiconductor component containing at least one pn junction which extends inside a semiconductor substrate and which is formed by a laterally bounded, highly doped zone extending inwards from a main surface of the semiconductor substrate and by a lightly doped zone surrounding the highly doped zone and emerges at the main surface of the semiconductor substrate at an edge of the highly doped zone, the edge of the highly doped zone being formed by a guard zone whose doping density gradually decreases in a direction parallel to the main surface from the highly doped zone towards the pn junction.

2. Discussion of background

In the regions where the reverse-blocking pn junction emerges at the surface of the semiconductor substrate, semiconductor components designed for high reverse voltages require special measures to ensure the blocking capacity of the semiconductor component. The reason for this is that, without such measures, the surface breakdown already takes place long before reaching a reverse voltage which is limited by the volume breakdown and thus reduces the dielectric strength of the semiconductor component in an unacceptable manner.

As is evident from the publication entitled "Methods of avoiding edge effects on semiconductor diodes", by P. A. Tove, J. Phys. D: Appl. Phys, 15 (1982), a large number of very varied measures of this type are now known which all have the object of reducing as greatly as possible the maximum field strengths occurring in the region where the reverse-blocking pn junction emerges at the surface so that the volume breakdown takes place, if possible, before the surface breakdown.

The known measures may be divided roughly into two categories, the first comprise measures which provide an external structure of the surface (grinding edge profiles, edging trenches) and the second comprise those measures which are based solely on a suitable internal doping structure with the surface remaining intact.

For semiconductor components having fine structures or having integrated MOS structures which permit the use of the dividing technique in their production, those measures are primarily of importance which leave the surface of the semiconductor substrate intact. These include, for example, guard rings and VLD structures (VLD=Variation of Lateral Doping). Where as guard rings fulfil their intended function only if they are very precisely dimensioned and manufactured, VLD structures are a rugged alternative.

The use of a VLD structure to increase the dielectric strength is known from "Variation of lateral doping—a new concept to avoid high voltage breakdown of planar junctions", by R. Stengl and U. Gösele, IEEE 1985. At an edge of a highly doped zone, the doping density is reduced linearly in a direction parallel to a main surface of the semiconductor substrate from the doping density of the highly doped zone to that of a slightly doped zone. Such a so-called lateral gradient of the doping density of the VLD structure is produced in a manner such that dopant is implanted through a mask having slots and gaps with precisely adjusted dimensions and a preliminary predeposition produced in this manner is diffused in.

In this manner, semiconductor components can be realized whose reverse dielectric strength is about 90 percent of the volume breakdown. Even if such values are good for the reverse dielectric strength compared with other arrangements, they do not represent the desirable optimum. In addition, the production of such a VLD structure presents a problem since, in the known process of P. A. Tove, even small irregularities in the mask result in undesirable undulations of the pn junction which lower the reverse dielectric strength of the semiconductor component.

SUMMARY OF THE INVENTION

Accordingly, one object of this invention is to provide a semiconductor component having at least one pn junction which extends inside a semiconductor substrate and which is formed by a laterally bounded, highly doped zone extending inwards from a main surface of the semiconductor substrate and by a lightly doped zone surrounding the highly doped zone and emerges at the main surface of the semiconductor substrate at an edge of the highly doped zone, the edge of the highly doped zone being formed by a guard zone whose doping density decreases gradually in a direction parallel to the main surface from the highly doped zone towards the pn junction, which semiconductor component has a reverse dielectric strength which is limited solely by the volume breakdown and which is simple to manufacture. Another object of the invention is to provide a process for manufacturing such a semiconductor component.

According to the invention, the solution is that the guard zone has a maximum penetration depth near the highly doped zone and that the maximum penetration depth of the guard zone is greater than the penetration depth of the adjacent highly doped zone.

A preferred embodiment is represented by the guard zone whose doping density decreases approximately linearly in the direction parallel to the main surface.

A further preferred embodiment relates to the guard zone whose doping density decreases stepwise in the direction parallel to the main surface, at least two steps being formed.

As a result of the fact that the pn junction is concave at the edge of the highly doped zone, maximum fields strengths are reduced in this critical region. Owing to the large penetration depth of the guard zone, the pn junction has a large reverse dielectric strength in this region owing to the low doping gradient in a direction perpendicular to the main surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows an axial section through a semiconductor component having a guard zone according to the invention, FIG. 2a shows a representation of the doping density of a guard zone according to the invention having a linearly decreasing doping density, FIG. 2b shows a detail from an axial section through a corresponding semiconductor component according to FIG. 2a, FIG. 3a shows a representation of the doping density of a guard zone according to the invention having two steps.

DESCRIPTION OF THE PREFERRED EMBODIMENTS

Figures 3A, 3B:
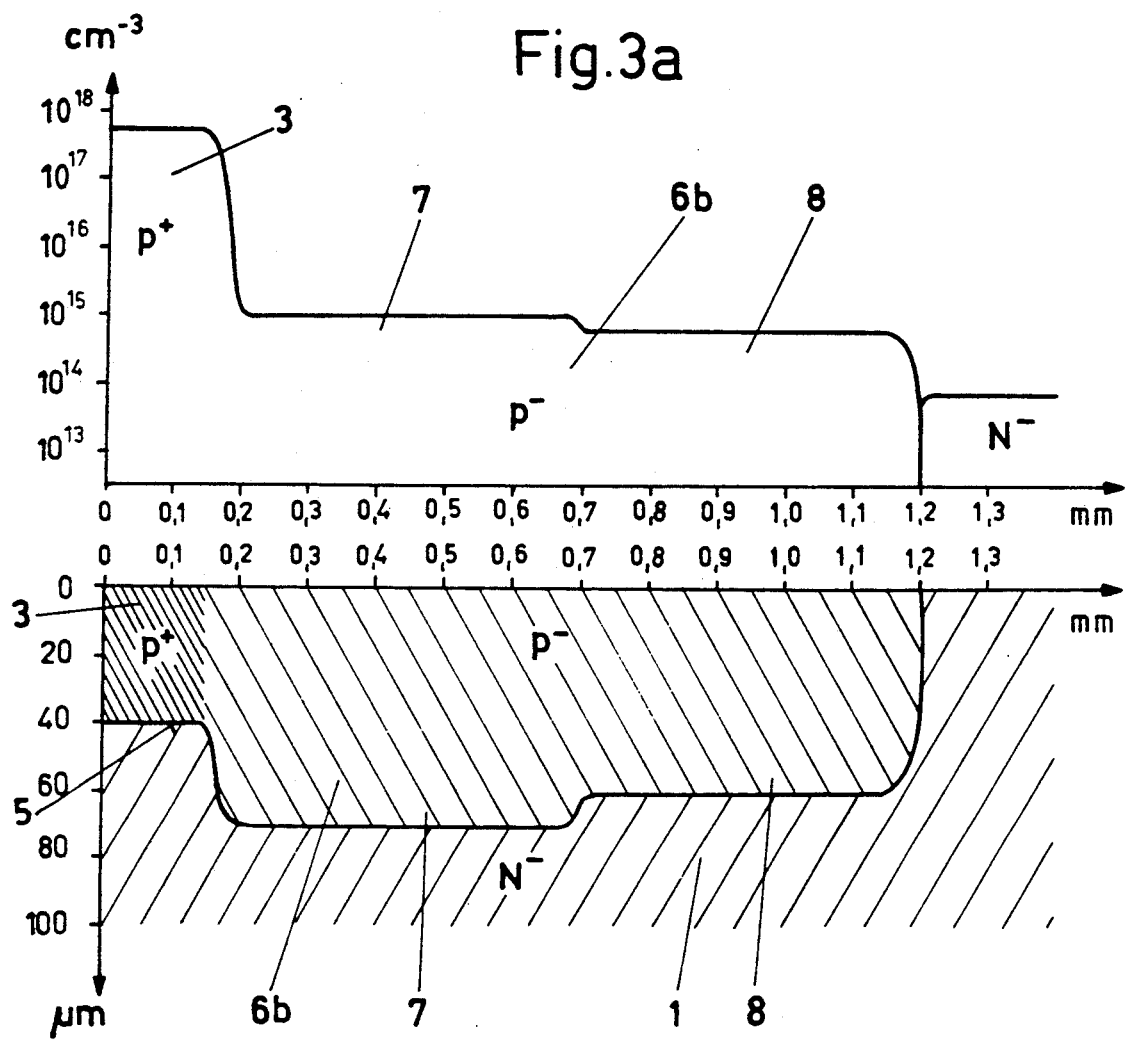
FIG. 3b shows a detail from an axial section through a corresponding semiconductor component according to FIG. 3a, FIGS. 4a-f show a representation of process steps in the manufacture of a semiconductor component having a guard zone with a linearly decreasing doping density.

Referring now to the drawings, wherein like reference numerals designate identical or corresponding parts throughout the several views, a semiconductor component having a guard zone with wedge-shaped doping will be described in a first exemplary embodiment.

FIG. 1 shows an axial section through a semiconductor component having a guard zone according to the invention. In order to be able to present the essential features of the invention as clearly as possible, a high reverse-blocking diode has been chosen as the semiconductor component.

A slightly doped semiconductor substrate 1 has a basic doping of about $7.5 \times 10^{13}$ cm$^{-3}$. From a main surface 2 of the semiconductor substrate 1 a laterally bounded, highly doped zone 3 extends inwards into the semiconductor substrate. In this manner, a high reverse-blocking pn junction 5 is formed between the highly doped zone 3 and the slightly doped semiconductor substrate 1 which surrounds the highly doped zone 3 as a slightly doped zone.

In this exemplary embodiment, the semiconductor substrate 1 is n$^-$-doped and the highly doped zone 3 is p$^+$-doped. To make contact with the semiconductor substrate 1, a contact diffusion 4 is provided which is n$^+$-doped in a known manner.

Protective zones 6a and 6b adjoin the highly doped zone 3 and form the edge thereof. They are p$^-$-doped and bring the pn junction 5 to the main surface 2.

FIG. 2b shows a detail from FIG. 1. The lateral extension is plotted in mm on the horizontal axis, the origin of the horizontal axis being arbitrarily chosen. A penetration depth in pm is plotted on the vertical axis. The horizontal axis is also the main surface 2 of the semiconductor substrate 1. The highly doped zone 3 extends about 15 μm inwards into the semiconductor substrate 1. The guard zone 6b extends around 70 μm inwards. It has a width b of around 0.6 mm.

FIG. 2a shows a representation of the variation of the doping density across the main surface 2 of the semiconductor substrate 1. The horizontal axis is marked in the same way as in FIG. 2b. The doping density across the main surface 2 of the semiconductor substrate is plotted on the vertical axis. In the highly doped zone 3, the doping density beneath the main surface is somewhat less than $10^{18}$ cm$^{-3}$. In a region where the highly doped zone 3 adjoins the guard zone 6b, the doping density decreases sharply from about $10^{18}$ cm$^{-3}$ to the maximum doping density of the guard zone 6b of $10^{15}$ cm$^{-3}$ or less. From this point to an external end of the guard zone 6b where the pn junction 5 emerges at the main surface 2, the doping density decreases linearly in a direction parallel to the main surface down to a value of about $7.5 \times 10^{13}$ cm$^{-3}$ set by the doping density of the semiconductor substrate 1.

It is an advantage to dimension the guard zone 6b so that its maximum doping density, which should be in the vicinity of the highly doped zone 3, does not exceed a value of about $10^{15}$ cm$^{-3}$, that its width b is about equal to a thickness d of the slightly doped zone (in this case, of the semiconductor substrate 1) beneath the highly doped zone 3, and that its maximum penetration depth is between 40 μm and 80 μm.

In this manner, the following advantages are ensured:

Firstly, the high reverse-blocking pn junction 5 has a concave form in a region where the doping density decreases considerably towards the guard zone. It is thus possible to avoid in a simple manner the usual high field strengths in pn junctions with convex curvatures.

Secondly, the low gradient in a direction perpendicular to the main surface at the pn junction 5 between guard zone 6b and semiconductor substrate 1 results in a desirable high reverse dielectric strength. This is associated with the chosen large penetration depth of the guard zone 6b.

Thirdly, the operation of the guard zone is resistant to small inaccuracies both in relation to the doping density and also in relation to the penetration depth.

In a second exemplary embodiment, a semiconductor component is described which has a guard zone whose doping density decreases stepwise in a direction parallel to the main surface. The semiconductor component is again basically constructed as in FIG. 1. Only the guard zones 6a and 6b are constructed as described below.

FIG. 3b shows a detail from FIG. 1. The horizontal and vertical axes are marked as in FIG. 2b. The highly doped zone 3, the slightly doped semiconductor substrate 1, the pn junction 5 and the guard zone 6b can be perceived. The guard zone 6b breaks down into a first step 7 which adjoins the highly doped zone 3 and into a second step 8 which brings the pn junction to the main surface 2 at one end of the guard zone. The first step 7 extends inwards about twice as deep as the adjacent highly doped zone 3. The second step 8 extends inwards somewhat less deeply than the first step 7.

In the same way as is shown in FIG. 2a, FIG. 3a again shows a representation of the variation of the doping density across the main surface 2 of the semiconductor substrate 1. The highly doped zone 3 having a doping density of somewhat less than $10^{18}$ cm$^{-3}$ adjoins the first step 7 of the p$^-$-doped guard zone 6b which preferably has a doping density of about $10^{15}$ cm$^{-3}$. The second step 8 preferably has a doping density which is about half as great as that of the first step 7. The two steps are about equally wide.

In this exemplary embodiment, the first step 7 has a doping density of about $10^{15}$ cm$^{-3}$ and the second step a doping density of about $5 \times 10^{14}$ cm$^{-3}$. The penetration depth is about 70 μm for the first step and about 60 μm for the second step. Each step is about 0.5 mm wide.

According to the invention, the guard zone must have at least two steps. The stepwise doping density can be regarded as an approximation of the linearly decreasing doping density. Accordingly, the following rule may be drawn up for dimensioning steps: choose a width of the guard zone, divide the latter up into a desired number of steps and set the doping density of the individual steps at a value which would result as a maximum value in the region of the respective step in realizing a linearly decreasing doping density.

It has emerged that, in practice, two steps are sufficient to be able to essentially ensure the advantages achieved by a linearly decreasing doping density. It has been confirmed experimentally that, even in semiconductor components which have a guard zone according to the invention containing only two steps, the volume breakdown takes place before the surface breakdown, as desired.

The invention has a large number of possible applications. It is obvious that, as a modification of the exemplary embodiment, the highly doped zone 3 can be chosen as n+-doped and the semiconductor substrate 1 as p−-doped. It is also not essential to the invention that the pn junction be formed between a highly doped zone and the semiconductor substrate. On the contrary, the invention may also be applied to pn junctions which are formed by two diffused-in zones. The highly doped zone 3 always has a doping density of about $10^{17}$–$10^{19}$ cm$^{-3}$.

The fact that the invention has been explained on the basis of a simple diode is based more on an instructive consideration than on the preferred application. As mentioned in the introduction, the invention is directed primarily to finely structured semiconductor components with high reverse-blocking pn junctions such as, for example, GTO thyristors or MOS controlled thyristors. It may be stated quite generally that the invention may be employed with advantage wherever high reverse-blocking pn junctions emerge at a main surface.

The present invention does not, however, provide only semiconductor components with high reverse-blocking pn junctions, but it also provides processes for manufacturing them. These processes will be explained in more detail below on the basis of the two exemplary embodiments described above. First, a manufacturing process will be specified which are suitable for producing a guard zone with a linearly decreasing doping density.

Figure 4A:
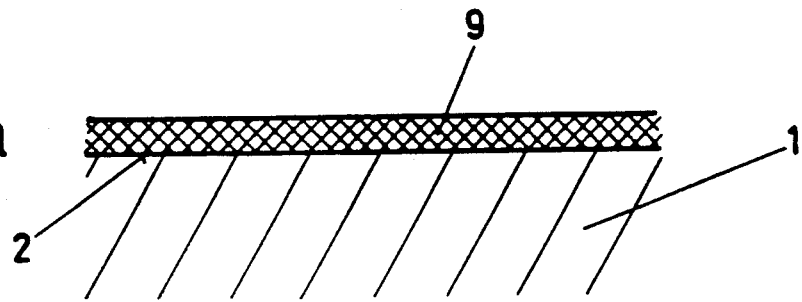
Figure 4B:
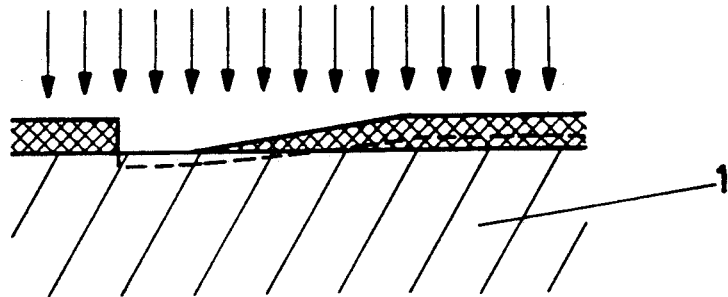
Figure 4C:
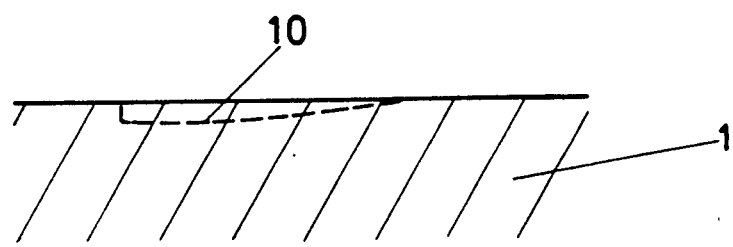
Figure 4D:
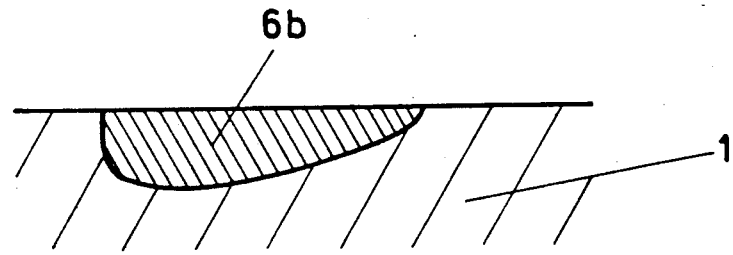

FIGS. 4a-d show the individual process steps. The starting point is a semiconductor substrate 1 with a required doping. A main surface 2 of the semiconductor substrate 1 intended for the diffusion of the highly doped zone 3 is covered with a masking layer 9, for example, of SiO$_2$. Using an RIE process (RIE=Reactive Ion Etching), such as is disclosed, for example, in the patent application CH 1091/86, the masking layer 9 is etched away in a wedge shape manner where the guard zone is planned. The required doping atoms are implanted in the semiconductor substrate 1 masked in this manner at a given energy. The energy should be so dimensioned that the wedge-shaped masking layer 9 prevents any penetration of the doping atoms into the semiconductor substrate at its blunt end (FIG. 4d).

After completely removing the masking layer 9, semiconductor substrate 1 is present which has a gradually tapering deposit 10 in a region intended for the guard zone (FIG. 4c). In a subsequent diffusion treatment, this deposit 10 is diffused into the desired depth (4d).

Figure 4E:
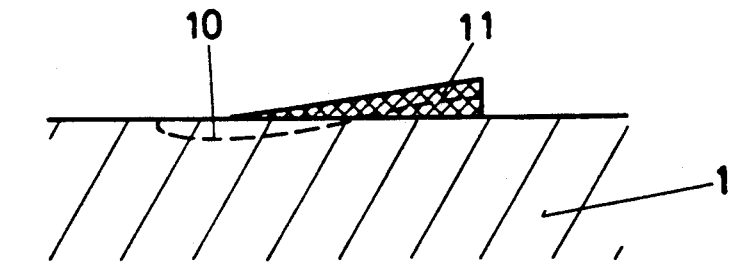
Figure 4F:
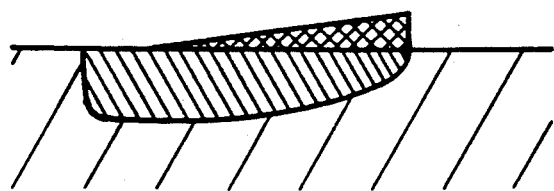

In a modification of the process just described, the wedge-shaped masking layer 9 in the region of the guard zone is not removed (FIG. 4e) so that the wedge-shaped masking layer 9 serves as a diffusion source 11 in the subsequent diffusion treatment (FIG. 4f).

In order to manufacture a semiconductor component having a guard zone with a stepwise doping density, it is possible to proceed, according to the invention, as described below. The object of the process may be a two-step guard zone as has been described, for example, in the second exemplary embodiment.

Figure 5A:
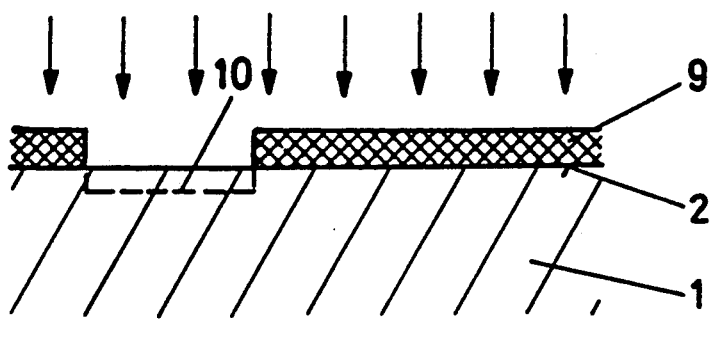
FIGS. 5a-e show a representation of process steps for manufacturing a semiconductor component having a guard zone doped in two steps with the aid of two implantation steps.
Figure 5B:
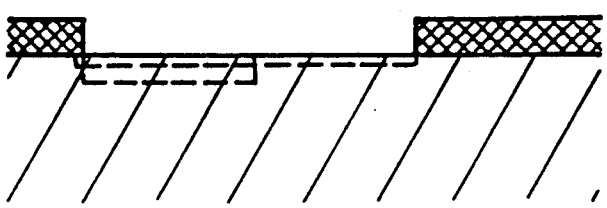
Figure 5C:
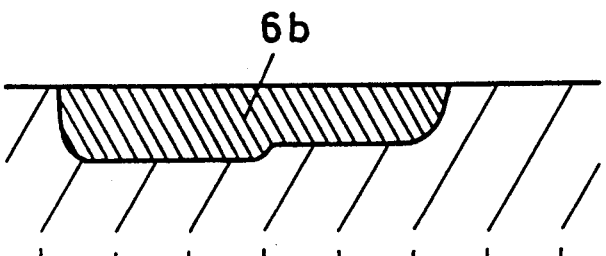

FIGS. 5a to 5c represent the process steps essential to the invention. A main surface 2 of a semiconductor substrate 1 is covered with a masking layer 9 of, for example, SiO$_2$ which only exposes those regions of the main surface 2 which are intended to form a highly doped first step 7 of the guard zone. Then a required dopant is implanted in the semiconductor substrate with a given energy (FIG. 5a). The energy is so dimensioned that the doping atoms cannot penetrate the masking layer 9. The masking layer 9 is now removed to an extent such that the main surface 2 is exposed in the entire region of the guard zone. The deposit 10 necessary to produce the second step 8 is produced with a second implantation (FIG. 5b). The masking layer 9 is completely removed before a subsequent diffusion treatment. Lastly, FIG. 5c shows the finally diffused-in guard zone 6b.

Figure 5D:
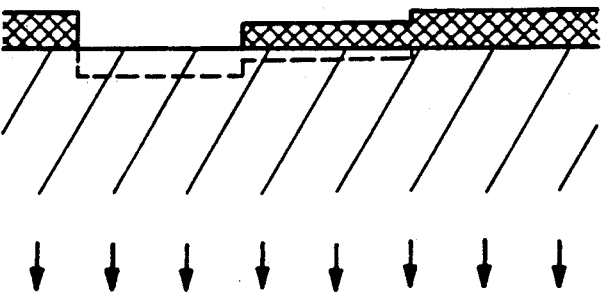
Figure 5E:
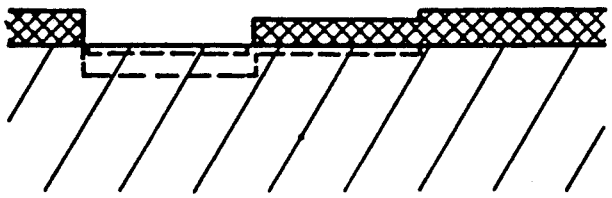

Instead of employing two different masks, it is also possible to employ two different energies for the implantations. The process steps necessary for this purpose are shown in FIGS. 5d and 5e. In a region of the main surface 2 which is intended for the slightly doped second step 8 of the guard zone, the masking layer 9 is somewhat thinner than in the other regions. The regions of the main surface intended for the highly doped first step 7 of the guard zone are again free of the masking layer 9. The implantation of doping atoms takes place at two different energies. With a given high energy, the doping atoms are able to penetrate the masking layer 9 in the region of the second step 8, but not at a lower energy. The masking layer 9 outside the regions intended for the guard zone is sufficiently thick so that the doping atoms are unable to penetrate the masking layer 9 even at the high energy. As in the process previously described, the masking layer 9 is then completely removed and the diffusion treatment is carried out (FIG. 5c).

A third preferred process for manufacturing a semiconductor component with a stepwise doping density uses a diffusion source in the region where the slightly doped, second step 8 of the guard zone is planned.

Figure 6A:
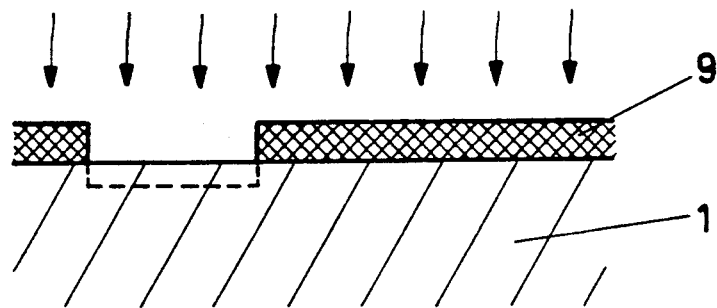
FIGS. 6a-c show a representation of process steps for manufacturing a semiconductor component having a guard zone doped in two steps with the aid of a single implantation step.
Figure 6B:
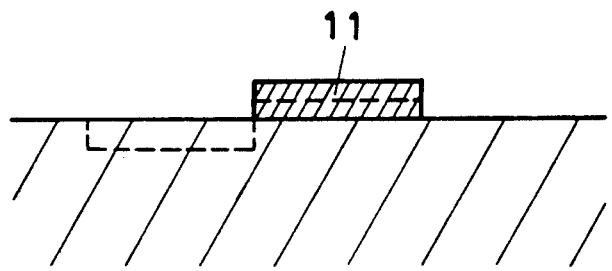
Figure 6C:
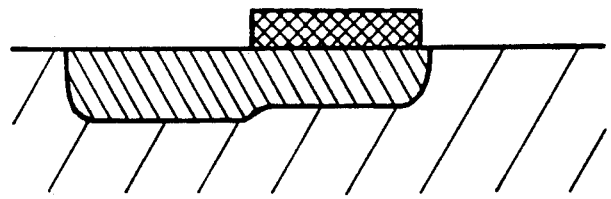

FIGS. 6a-c represent the process steps essential to the invention. A main surface 2 of a semiconductor substrate 1 is covered with a masking layer 9 which exposes only the regions intended for the first step of the guard zone. The implantation of the doping atoms is carried out at an energy which does not permit the doping atoms to penetrate the masking layer 9 (FIG. 6a). Then the masking layer 9 is removed, except in the regions which are intended for the slightly doped second step 8 (FIG. 6b). In the subsequent diffusion treatment, this remaining part of the masking layer 9 with the doping atoms implanted therein acts as diffusion source 11. The slightly doped second step 8 of the guard zone is consequently produced by the diffusion source 11 (FIG. 6c).

Even if only processes for manufacturing semiconductor components with guard zones doped in two steps are described in more detail, this does not mean that guard zones doped in three or more steps cannot be produced in applying this basic idea.

The processes according to the invention for producing guard zones according to the invention may be regarded as separate processes independent of the semiconductor component to be realized in each case. They may therefore be classified within the framework of the usual manufacturing steps (for example, implantation, diffusion).

In conclusion, it may be stated that the invention provides an effective measure of preventing surface breakdowns in high reverse-blocking pn junctions which emerge at a main surface of a semiconductor substrate.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A semiconductor element, comprising:
   a semiconductor substrate containing at least a first high reverse blocking pn junction, said first pn junction being formed at a boundary of a heavily doped zone of a first conductivity type and a lightly doped zone of a second conductivity type;
   wherein:
   the heavily doped zone extends from a main surface of said semiconductor substrate inwards into the semiconductor substrate and is surrounded by the lightly doped zone;
   further comprising:
   a guard zone adjoining the heavily doped zone and forming a second pn junction at a boundary of said guard zone and the lightly doped zone, said second pn junction terminating at said main surface;
   wherein:
   a doping density of the guard zone decreases in a direction parallel to the main surface from the heavily doped zone towards the second pn junction;
   the guard zone has a maximum depth of penetration near the heavily doped zone;
   the maximum depth of penetration of the guard zone is greater than a depth of penetration of the heavily doped zone;
   the guard zone has a maximum doping density less than $10^{15}$ cm$^{-3}$;
   the guard zone has a width which is comparable with a thickness of the lightly doped zone; and
   the maximum depth of penetration of the guard zone is not less than 40 $\mu$m and not more than 80 $\mu$m.

2. Semiconductor element according to claim 1, wherein the doping density of the heavily doped zone has a concentration less than $10^{18}$ cm$^{-3}$ and decreases sharply from said concentration to a maximum doping density of the guard zone.

3. Semiconductor element according to claim 1, wherein the doping density of the guard zone decreases in at least two steps and a first step extends into said semiconductor substrate about twice as deep as the heavily doped zone.

4. Semiconductor element according to claim 3, wherein the doping density of the guard zone decreases in precisely two steps and the doping density of a second step of the two steps is about half as great as that of a first step.

5. Semiconductor element according to claim 1, wherein the doping density of the guard zone decreases approximately linearly in the direction parallel to the main surface.

6. A semiconductor structure with a pn junction for use in a thyristor, comprising:
   a semiconductor substrate containing at least a first high reverse blocking pn junction, said first pn junction being formed between a boundary of a heavily doped zone of a first conductivity type and a lightly doped zone of a second conductivity type;
   wherein:
   the heavily doped zone extends from a main surface of said substrate inwards into the semiconductor substrate and is surrounded by the lightly doped zone;
   further comprising:
   a guard zone adjoining the heavily doped zone and forming a second pn junction at a boundary of said guard zone and the lightly doped zone, said second pn junction terminating at said main surface;
   wherein:
   a doping density of the guard zone decreases in a direction parallel to the main surface from the heavily doped zone towards the second pn junction;
   the guard zone has a maximum penetration depth near the heavily doped zone;
   the maximum depth of penetration of the guard is greater than a depth of penetration of the heavily doped zone;
   the guard zone has a maximum doping density less than $10^{15}$ cm$^{-3}$;
   the guard zone has a width which is comparable with a thickness of the lightly doped zone; and
   the maximum depth of penetration of the guard zone is not less than 40 $\mu$m and not more than 80 $\mu$m.

7. A semiconductor element comprising:
   a semiconductor substrate having a main surface;
   a first zone of a first conductivity type and first doping density extending from said main surface inwards into said semiconductor substrate;
   a second zone of a second conductivity type, predetermined thickness, and second doping density surrounding said first zone, wherein said first doping density is higher than said second doping density;
   a first pn junction formed between said first and second zones;
   a guard zone formed to adjoin said first zone and forming a second pn junction between said guard zone and said second zone, said guard zone having a predetermined doping density less then $1.10^{15}$ cm$^{-3}$, a maximum depth of penetration and width;
   said doping density of said guard zone decreasing in a direction parallel to said main surface from said first zone towards said second pn junction;
   said maximum depth of penetration of said guard zone appearing near said first zone and being greater than a depth of penetration of the first zone; and
   said width of said guard zone being comparable to the predetermined thickness of the second zone.

8. A semiconductor element comprising:
   a semiconductor substrate having a main surface;

a first zone of a first conductivity type and first doping density extending from said main surface inwards into said semiconductor substrate;

a second zone of a second conductivity type, predetermined thickness, and second doping density surrounding said first zone, wherein said first doping density is higher than said second doping density;

a first pn junction formed between said first and second zones;

a guard zone formed to adjoin said first zone and forming a second pn junction between said guard zone and said second zone, said guard zone having a predetermined doping density, maximum depth of penetration and width;

said doping density of said guard zone decreasing in a direction parallel to said main surface from said first zone towards said second pn junction wherein the doping density of the guard zone decreases in precisely two steps with a first step extending inwards about twice as deep as the first zone and the doping density of a second step of the two steps is about half as great as that of a first step;

said maximum depth of penetration of said guard zone appearing near said first zone and being greater than a depth of penetration of the first zone; and said width of said guard zone being comparable to the predetermined thickness of the second zone.

* * * * *